United States Patent
Chen et al.

(10) Patent No.: US 10,319,657 B2
(45) Date of Patent: Jun. 11, 2019

(54) CIRCUIT PACKAGE HAVING A PLURALITY OF EPOXY MOLD COMPOUNDS WITH DIFFERENT COMPOSITIONS

(71) Applicant: HEWLETT-PACKARD DEVELOPMENT COMPANY, L.P., Houston, TX (US)

(72) Inventors: Chien-Hua Chen, Corvallis, OR (US); Michael W Cumbie, Albany, OR (US)

(73) Assignee: HEWLETT-PACKARD DEVELOPMENT COMPANY, L.P., Spring, TX (US)

( * ) Notice: Subject to any disclaimer, the term of this patent is extended or adjusted under 35 U.S.C. 154(b) by 0 days.

(21) Appl. No.: 15/546,846

(22) PCT Filed: Mar. 27, 2015

(86) PCT No.: PCT/US2015/023049
§ 371 (c)(1),
(2) Date: Jul. 27, 2017

(87) PCT Pub. No.: WO2016/159937
PCT Pub. Date: Oct. 6, 2016

(65) Prior Publication Data
US 2018/0025960 A1    Jan. 25, 2018

(51) Int. Cl.
*H01L 23/29* (2006.01)
*H01L 21/00* (2006.01)
(Continued)

(52) U.S. Cl.
CPC ........ *H01L 23/3192* (2013.01); *B81B 7/0061* (2013.01); *H01L 21/565* (2013.01); *H01L 23/295* (2013.01); *H01L 23/3135* (2013.01); *H01L 23/3185* (2013.01); *H01L 23/3737* (2013.01); *H01L 24/96* (2013.01); *H01L 2924/10253* (2013.01); *H01L 2924/3511* (2013.01)

(58) Field of Classification Search
CPC . H01L 23/3192; H01L 21/565; H01L 23/295; H01L 23/3135; H01L 23/3185; H01L 23/3737; H01L 24/96; B81B 7/0061
See application file for complete search history.

(56) References Cited

U.S. PATENT DOCUMENTS 5,793,118 A * 8/1998 Nakajima ............. H01L 21/565
257/706
7,906,860 B2    3/2011 Meyer et al.
(Continued)

OTHER PUBLICATIONS

Abdullah, I, et al. Reduction of Warpage Occurence Stack-Die QFN Through FEA and Statistical Method. Solid State Science and Technology, vol. 16, No. 1 (2008).
(Continued)

*Primary Examiner* — Alonzo Chambliss
(74) *Attorney, Agent, or Firm* — HP Inc. Patent Department (57) ABSTRACT

A circuit package panel containing a packaging of epoxy mold compounds and a circuit device in the packaging, wherein the packaging comprises, at least one hybrid layer of a first epoxy mold compound and a second epoxy mold compound of a different composition.

17 Claims, 8 Drawing Sheets

(51) Int. Cl.
*H01L 23/31* (2006.01)
*H01L 21/56* (2006.01)
*B81B 7/00* (2006.01)
*H01L 23/373* (2006.01)
*H01L 23/00* (2006.01)

(56) References Cited

U.S. PATENT DOCUMENTS

| | | | |
|---|---|---|---|
| 8,334,602 B2 | 12/2012 | Kang et al. | |
| 8,525,341 B2 | 9/2013 | Kim et al. | |
| 8,653,676 B2* | 2/2014 | Kim | H01L 24/19 |
| | | | 257/790 |
| 8,809,125 B2* | 8/2014 | Aizpuru | H01L 33/56 |
| | | | 257/E33.056 |
| 9,768,038 B2* | 9/2017 | Lin | H01L 21/568 |
| 2002/0168798 A1* | 11/2002 | Glenn | H01L 21/56 |
| | | | 438/113 |
| 2003/0036587 A1 | 3/2003 | Kozak | |
| 2006/0016780 A1 | 1/2006 | Bengali | |
| 2006/0065984 A1 | 3/2006 | Matayabas et al. | |
| 2007/0045876 A1* | 3/2007 | Onodera | H01L 21/568 |
| | | | 257/790 |
| 2008/0061447 A1* | 3/2008 | Matayabas, Jr. | H01L 23/3121 |
| | | | 257/777 |
| 2008/0090439 A1 | 4/2008 | Beaman et al. | |
| 2009/0244180 A1 | 10/2009 | Panchawagh et al. | |
| 2012/0033017 A1 | 2/2012 | Iwanaga et al. | |
| 2012/0104435 A1 | 5/2012 | Lee et al. | |
| 2012/0193779 A1 | 8/2012 | Lee et al. | |
| 2012/0205820 A1 | 8/2012 | Oda et al. | |
| 2013/0147054 A1 | 6/2013 | Lin et al. | |
| 2013/0337614 A1 | 12/2013 | Fuergut et al. | |
| 2014/0091460 A1 | 4/2014 | Lee et al. | |

OTHER PUBLICATIONS

Lin, et al. PoP/CSP Warpage Evaluation and VIscoelastic Modeling.

* cited by examiner

CIRCUIT PACKAGE HAVING A PLURALITY OF EPOXY MOLD COMPOUNDS WITH DIFFERENT COMPOSITIONS

BACKGROUND

Circuits such as integrated circuits are oftentimes packaged in an epoxy mold compound packaging to support and protect the circuitry. Depending on the manufacturing method used, it may be difficult to control dimensions, shapes or certain properties of packaged circuits.

BRIEF DESCRIPTION OF THE DRAWINGS

For the purpose of illustration, certain examples constructed in accordance with this disclosure will now be described with reference to the accompanying drawings, in which.

DETAILED DESCRIPTION

In the following detailed description, reference is made to the accompanying drawings. The examples in the description and drawings should be considered illustrative and are not intended as limiting to the specific example or element described. Multiple examples can be derived from the following description and drawings through modification, combination or variation of the different elements.

Figure 1:
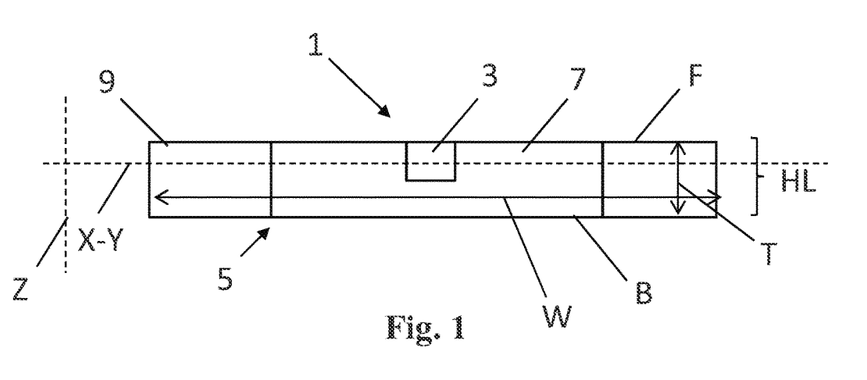
FIG. 1 illustrates a diagram of an example circuit package in a cross sectional side view.

FIG. 1 illustrates a diagram of a cross-section of a panel-shaped circuit package 1. The circuit package 1 has a panel shape in the sense that it has a thickness T between a back and front surface B, F, that is much less than its width W or length. For example its thickness T can be at least five times, or at least ten times its width W and/or length (in the drawing, the length extends into the page). In the drawing, the thickness extends in a Z-direction while the length and width W extend parallel to an X-Y plane.

The circuit package 1 may be a component of, or an intermediate product for, a larger apparatus. The circuit package 1 includes a circuit device 3 packaged in a hybrid epoxy mold compound packaging 5. The packaging 5 includes at least two epoxy mold compounds 7, 9 that are each of different compositions. For example a filler density or filler diameter of each compound 7, 9 may be different. The circuit device 3 is provided near a front face F of the circuit package 1, opposite to a back face B.

The packaging 5 includes at least one hybrid layer HL that includes both epoxy mold compounds 7, 9. The hybrid layer HL extends parallel to the front face F of the circuit package 1. In the illustrated example the packaging consists of the hybrid layer HB but in other examples the hybrid layer HB may be provided between other layers that may consist of a single epoxy mold compound.

The example epoxy mold compounds 7, 9 of different compositions that are patterned in a single plane X-Y. For example, one of the compounds 7 is a bulk compound (i.e. that forms the bulk of the total volume of the packaging), while the other compound 9 may be patterned with respect to the bulk compound to control certain properties associated with the manufacture or use of the circuit device 1.

In one example the patterned second compound 9 has a different CTE (Coefficient of Thermal Expansion) than the first compound 7 of the same hybrid layer HL, to control warpage of the panel that would otherwise occur because of a higher CTE of the bulk epoxy mold compound with respect to the lower CTE of the circuit device 3. For example, the circuit device 3 may be contain conductive and/or semi-conductor materials that generally have lower CTEs than bulk epoxy mold compounds. The difference in CTEs may generate deformations in the package during cooling. To counter deformations such as warpage, the CTE is altered. The CTE can be altered by varying the weight percentage of the fillers in the compound, also referred to as filler density.

In other examples, one of the compounds could have a different average filler diameter, filler length or different weight and/or volume percentages of added components like fillers or other components. For example, a filler diameter can influence certain surface characteristics of laser ablated or cut panel parts. By patterning the second compound in the first compound (or vice versa) certain properties of the circuit package 1 can be controlled during manufacture or use of the circuit package 1.

Figure 2:
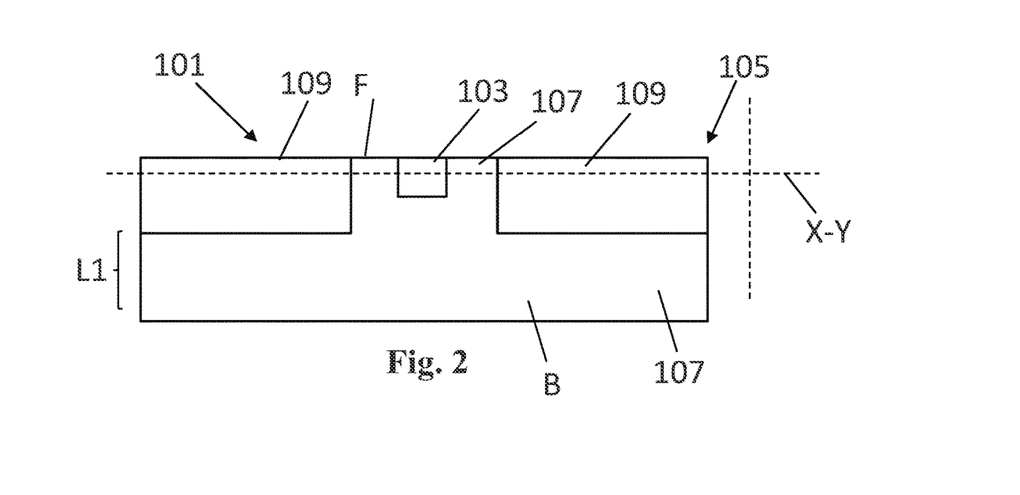
FIG. 2 illustrates a diagram of another example circuit package in a cross sectional side view.

FIG. 2 illustrates an example of a circuit package 101 including a circuit device 103 packaged in a packaging 105. The packaging 105 includes a first epoxy mold compound 107 of a first composition and a second epoxy mold compound 109 of a second composition. The packaging 105 includes a first layer L1 of a single epoxy mold compound 107. The packaging 105 includes a hybrid layer HL including both the first and second epoxy mold compounds 107, 109 in a single plane X-Y, over the first layer. The hybrid layer HL extends near a front face F. In the illustrated example the hybrid layer HL forms the front face F.

In the illustrated example the circuit device 103 extends in the first compound 107. The first compound 107 surrounds the circuit device 103 at the sides and back of the circuit device 103. The second compound 109 surrounds the first compound 107 within the hybrid layer HL. The second epoxy compound 109 extends along the sides and over the first compound 107. Hence, the second epoxy mold compound 109, the first epoxy mold compound 107 and the circuit device 103 are disposed next to each other. The first compound 107 may be a bulk compound of the packaging 105 and may extend under the second compound 109 and under the hybrid layer HL. The first compound 107 may form the back surface B of the circuit package 101.

The circuit package can be manufactured through compression molding. Compression molding involves heating an epoxy mold compound disposed in a mold, depositing the circuit device and compressing the assembly of the compound and the circuit device, and cooling the circuit package 101. The thermal expansion of the circuit device 103 and the thermal expansion of the first epoxy mold compound 107 are different. Hence, warpage could occur during cooling, if the circuit device 103 would be packaged in a packaging of the first or second epoxy mold compound only. For example, the back surface B could curve into a concave shape.

In one example, the second epoxy mold compound 109 has a higher CTE than the first epoxy mold compound 107. In a further example the second epoxy mold compound 109 has a lower weight percentage of fillers than the first epoxy mold compound 107 to achieve the higher CTE. A hybrid layer HL that includes both the first and second epoxy mold compound is deposited adjacent to the circuit device 103 to increase an overall CTE of the entire hybrid layer HL. This may compensate for the difference in CTE with the back surface B and control overall panel warpage. For example, the second epoxy mold compound 109 is disposed in a strategic quantity (e.g. thickness, surface) and location in the hybrid layer HL, near the front surface F.

By disposing a layer of the second epoxy mold compound 109 around the first epoxy mold compound 107 near the circuit device 103, an overall thermal expansion of the hybrid layer HL during cooling may be similar as, or of inverse shape with respect to, the thermal expansion near the back surface B. The second epoxy mold compound 109 can be patterned around the circuit device 103 and around the first epoxy mold compound 107 so as to control the bow or warpage of the circuit package 1. By obtaining a better control over panel bow with some of the example packages of this disclosure, certain design constraints can be relieved, such as circuit device thickness (versus length and width), number of circuit devices in a packaging, packaging thickness, mold temperature settings, substrate handling downstream of a compression mold such as an electrical redistribution layer (RDL) fabrication process, packaging clamping during cooling, and more.

Figure 3:
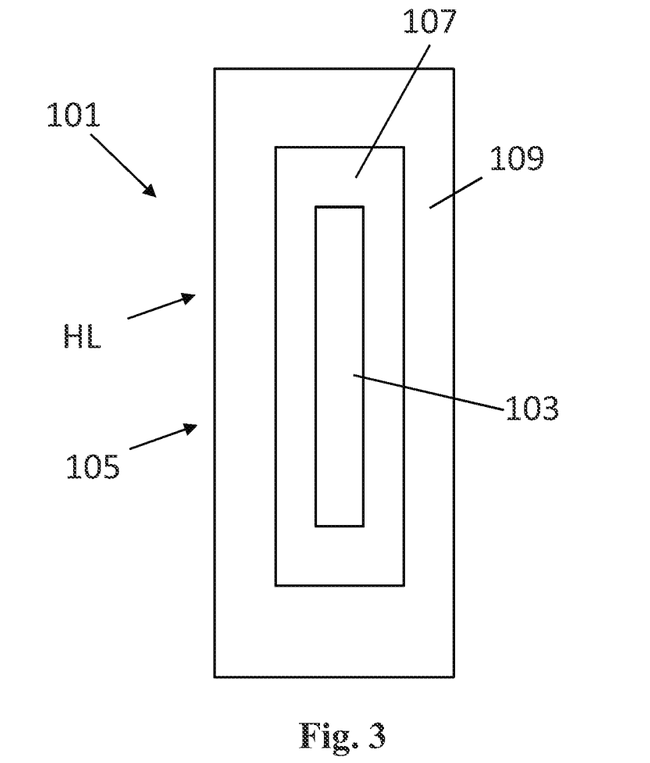
FIG. 3 illustrates a diagram of yet another example circuit package in a top view.

FIG. 3 illustrates the example of FIG. 2. in a top view, onto the front face F and the hybrid layer HL. As illustrated, in the hybrid layer HL, the first epoxy mold compound 107 surrounds the circuit device 103 and the second epoxy mold compound 109 surrounds the first epoxy mold compound 107.

Figure 4:
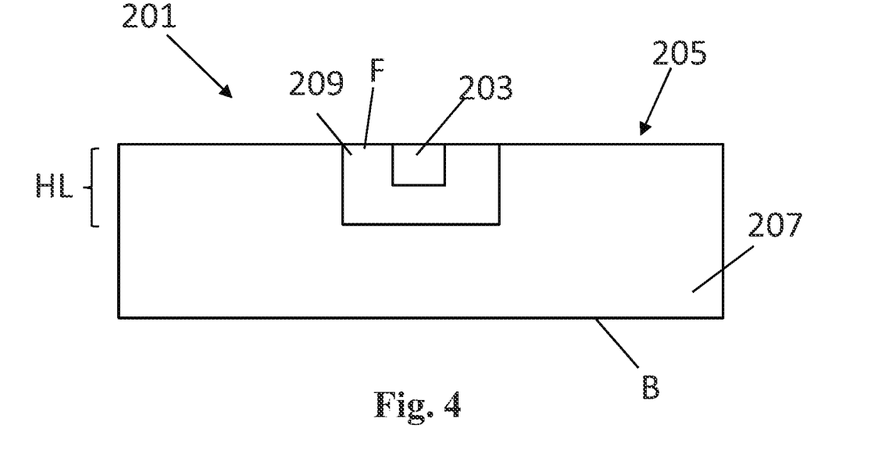
FIG. 4 illustrates a diagram of an example circuit package in a cross sectional side view.

FIG. 4 illustrates another example of a cross-sectional side view of a circuit package 201. The circuit package 201 includes a packaging 205 and a circuit device 203 packaged in the packaging 205. The packaging 205 includes two epoxy mold compounds 207, 209 of different compositions. For example, the packaging 205 includes a first, bulk epoxy mold compound 207 and a second epoxy mold compound 209 of different composition patterned in the first epoxy mold compound 207. In the example, the circuit device 203 is disposed in the second epoxy mold compound. A hybrid layer HL includes the circuit device 203, the second epoxy mold compound 209 surrounding the circuit device 203, and the first epoxy mold compound 207 surrounding the second epoxy mold compound 209. Hence, the first epoxy mold compound, the second epoxy mold compound and the circuit device are disposed next to each other. In one example the second epoxy mold compound 209 has a lower weight percentage of filler and higher CTE than the first epoxy mold compound 207. The first epoxy mold compound 207 surrounds the second epoxy mold compound 209 and extends under the second epoxy mold compound 209. For example, the first epoxy mold compound 207 forms a back surface of the package 201. A top view of the circuit package 201 could be similar to FIG. 3 with the difference that the second epoxy mold compound 209 directly surrounds the circuit device 203 and the first epoxy mold compound 207 directly surrounds the second epoxy mold compound 209. Similar to FIG. 2, a back portion of the circuit package 201 is formed of the first, bulk epoxy mold compound 207.

Figure 5:
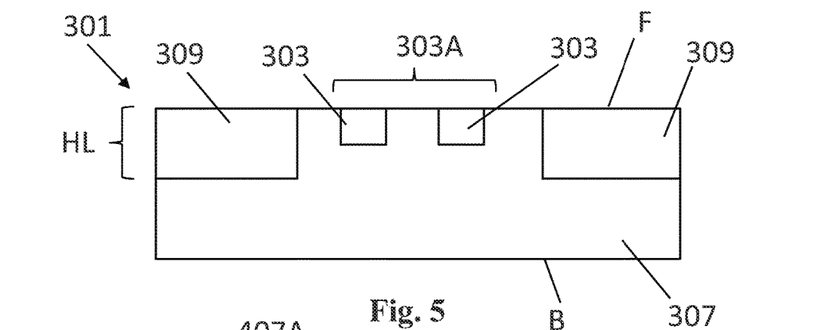
FIG. 5 illustrates a diagram of another example circuit package in a cross sectional side view.

FIG. 5 illustrates a circuit package 301 similar to the example of FIG. 2 having a circuit device array 303A deposited in the first epoxy mold compound 307. The array 303A includes at least one row and/or column of circuit devices 303. A hybrid layer HL of different epoxy mold compounds 307, 309 of different compositions is disposed over a back layer of the first epoxy mold compound 307 that forms the back face B. The hybrid layer HL forms the front face F. In the hybrid layer HL, the second epoxy mold compound 309 of different composition than the first, bulk epoxy mold compound 307 surrounds the first epoxy mold compound 307.

Figure 6:
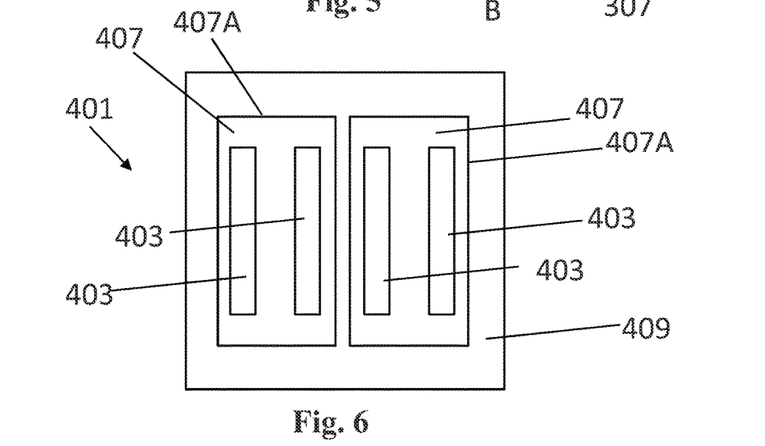
FIG. 6. Illustrates another example diagram of a circuit package in a top view.

FIG. 6 illustrates another example of a circuit package 401 including a circuit device array 403, in a top view onto the front face of the package 401. In the example, a hybrid layer may form the front face. The hybrid layer includes the circuit devices 403. The hybrid layer includes a pattern of a first epoxy mold compound 407 within a second epoxy mold compound 409 of a different composition than the first epoxy mold compound 407. For example, the pattern includes two islands 407A of the first epoxy mold compound 407. The second epoxy mold compound 409 surrounds each of the islands 407A. The islands 407A each connect to a thick layer of the first epoxy mold compound 407 that forms the back portion of the circuit package 407 (not illustrated). A thin layer of the second epoxy mold compound 409 may be patterned around the islands 407A, forming the hybrid layer. In different examples, different patterns of the first and/or second epoxy mold compounds 407, 409 may be provided in the hybrid layer. For example, relatively complex patterns can be formed. In an example, the second epoxy mold compound 409 has a lower CTE than the first epoxy mold compound 407, for example to compensate for panel bow.

Figure 7:
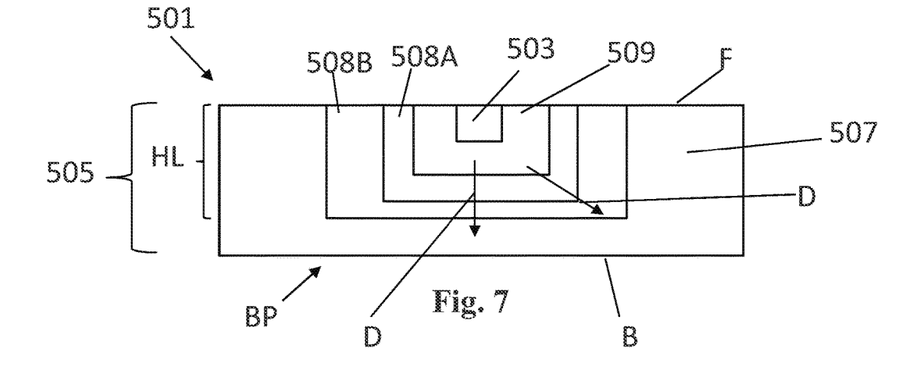
FIG. 7 illustrates a diagram of yet another example circuit package in a cross sectional side view.

FIG. 7 illustrates an example of a circuit package 501 in a cross sectional side view, having a gradient of filler densities. For example the circuit package 501 includes a circuit device 503 and a packaging 505 of different epoxy mold compounds 507, 509 of different compositions. The packaging 505 includes a first epoxy mold compound 507 that forms a back portion BP with a back surface B. The packaging 505 includes a second epoxy mold compound 509 that forms part of the front face F, into which the circuit device 503 is deposited. Near the front face F, the first epoxy mold compound 507 extends next to the second epoxy mold compound 509. The second epoxy mold compound 509 may surround the sides and back of the circuit device 503. The first epoxy compound 507 may surround the sides and back of the second epoxy compound 509. For example, the first epoxy mold compound 507 has a higher filler density than the second epoxy mold compound 509, and a lower CTE. Between the first and second epoxy mold compounds 507, 509, respectively, additional caps 508A, 508B of different epoxy mold compounds are provided that have varying filler densities. For example the epoxy mold compound caps 509, 508A, 508B, 507 may wrap around each other like onion shells of half an union. For example the filler density increases with each cap 509, 508A, 508B in a direction D away from the circuit device 503. Hence, a gradient of filler densities is provided in the epoxy mold compound packaging 505 around the circuit device 503. Note that, in one example, a filler density is a weight percentage of fillers in the compound. In one example, the filler density is to influence the CTE of the epoxy mold compound.

In other examples that are not illustrated, the filler density may decrease in a direction away from the circuit device. In yet other examples the filler density may vary, for example by first decreasing, increasing and decreasing again, in a direction away from the circuit device 503. In yet other examples, the gradient can be one of varying filler fineness, filler diameters, or other additives quantity or additives weight, etc. Having a gradient of a certain filler or other component or property may allow for a gradient of certain properties in a desired direction or location in the package 501.

Figure 8:
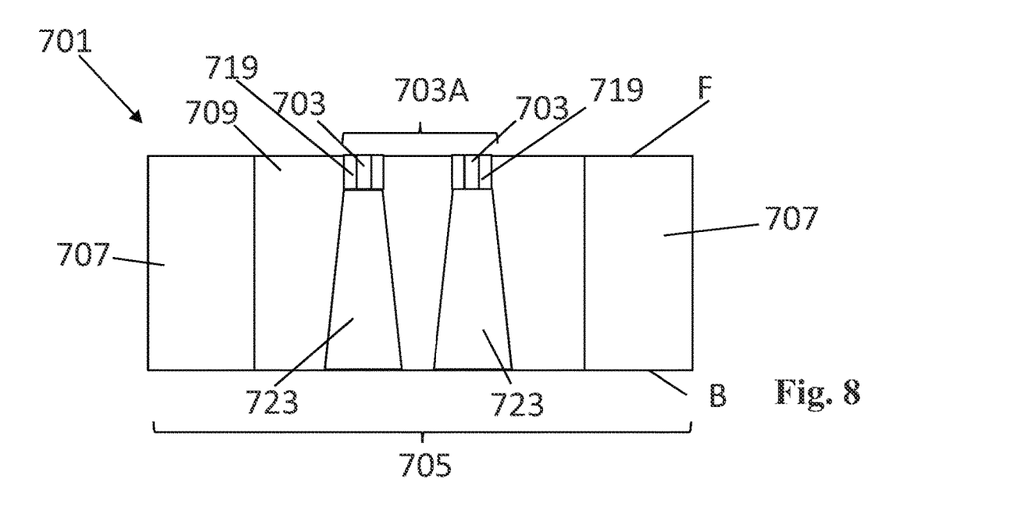
FIG. 8 illustrates a diagram of an example fluid circuit package in a cross sectional side view.

FIG. 8 illustrates an example of a fluidic circuit package 701 in a cross sectional side view. The fluidic circuit package 701 includes a packaging 705 of different epoxy mold compounds 707, 709. The packaging 705 includes a first epoxy mold compound 707 of a first composition and a second epoxy mold compound 709 of a different composition. A fluidic circuit device array 703A is disposed near a front face F. Each circuit device 703 of the array 703A includes fluid channels 719. The fluid channels 719 may include manifolds, chambers and nozzles to dispense fluid. The nozzles are provided in the front surface F. The fluid circuit devices 703 further include fluid propelling components such as resistors to propel or eject fluid. The fluid channels 719 may be of microscopic shape. For example each fluid circuit device 703 includes a nozzle array having a nozzle density of at least 300 nozzles per inch (NPI), at least 600 NPI, at least 900 NPI, at least 1200 NPI or more, and channels leading thereto. The packaging 705 further includes fluid holes 723 that run from a back B of the packaging 705 to each circuit device 703, to provide fluid to the channels 719 of the circuit device 703. The fluid holes 723 can be of a bigger diameter, on average, than the average diameter of the fluid channels 719 in the circuit devices 703, to deliver sufficient quantities of fluid to multiple nozzles or multiple nozzle arrays in the circuit devices 703.

In one example the fluid holes 723 are provided through at least part of the second epoxy mold compound. In the illustrated example the second epoxy mold compound extends from a back to a front face B, F of the package 701, whereby the fluid holes 723 extend completely through the second epoxy mold compound. In other examples the second epoxy mold compound may extend up to a back of the circuit devices 703, not reaching the front face F.

The second epoxy mold compound 707 may include on average finer fillers than the first epoxy mold compound 709. On average, the diameters of the fillers in the second epoxy mold compound 709 are smaller than the diameters of the fillers in the first epoxy mold compound. The finer fillers may allow for smoother walls of the fluid holes 723. For example the fluid holes 723 may be manufactured through laser ablation and the finer fillers allow for smoother walls after said laser ablation.

Figure 9:
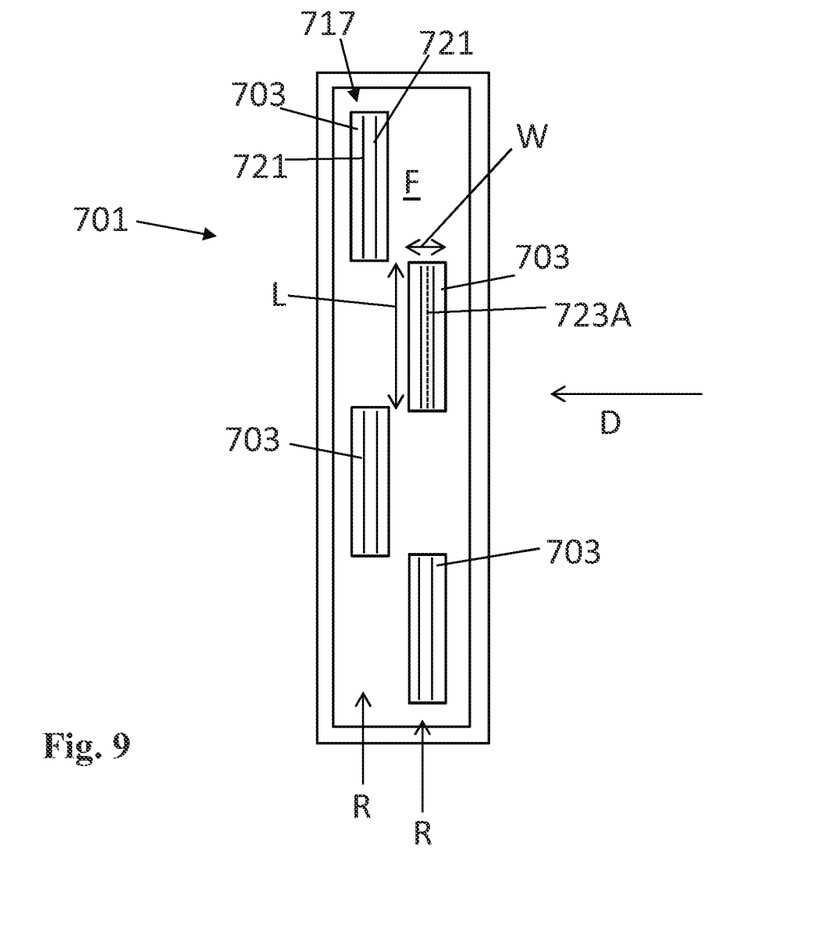
FIG. 9 illustrates a diagram of an example fluid circuit package in a top view.

FIG. 9 illustrates an example of the fluid circuit package 701 of FIG. 8 in top view. The fluid circuit package 701 may be a component of a high precision digital liquid dispensing module such as a media wide array print bar for two-dimensional or three-dimensional printing. The fluid circuit devices 703 may be shaped like relatively thin slivers 717, and may include silicon material. In the drawing arrays 721 of nozzles 723A are illustrated that open into the front surface F (FIG. 8) to eject fluid. In the illustrated example, each fluid circuit device 703 is provided with at least two nozzle arrays 721. Besides being relatively thin, in a further example, the fluid devices 703 have a relatively small width W and long length L. For example a ratio of length L versus width W may be at least approximately 25:1 or at least 50:1. The fluid circuit devices 703 may be arranged in two rows R so that subsequent nozzle arrays 721 in opposite rows R overlap so as to have continuous coverage of nozzle arrays 721 as seen from a side direction D perpendicular to said length L of the fluid circuit devices 703, as best illustrated by FIG. 9. In one example this allows for fluid ejection onto a complete width of a media that passes or extends under the fluid circuit package 701.

In other fluidic or non-fluidic applications similar panel-shaped packagings may be provided that package arrays of circuit devices, in rows and/or columns.

Figure 10:
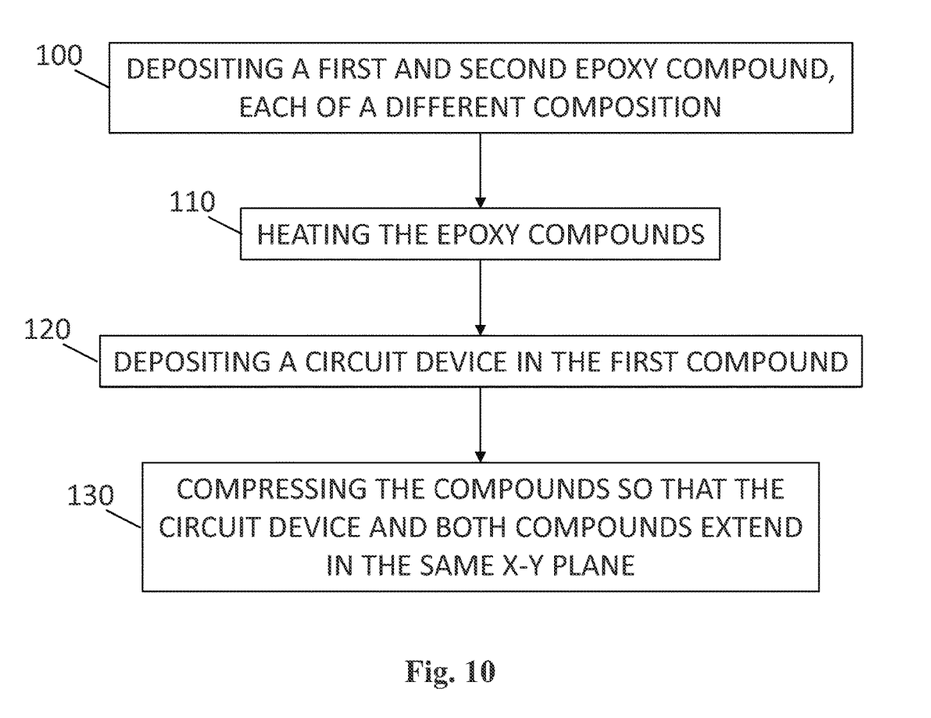
FIG. 10 illustrates a flow chart of an example of a method of compression molding.

FIG. 10 illustrates a flow chart of an example of compression molding a circuit package. The method includes depositing on a carrier a first epoxy mold compound and a second epoxy mold compound each of a different composition (block 100). In one example, the carrier is a mold cavity. In another example, the two mold compounds are disposed on a separate carrier and later cooled in the mold. The method includes heating the epoxy mold compounds (block 110). The method includes providing a circuit device in the first epoxy mold compound (block 120). The method further includes compressing the epoxy mold compounds so that both epoxy mold compounds extend in the same X-Y plane (block 130), perpendicular to a thickness direction. Then, the compressed package is cooled in the mold. For example the X-Y plane extends through a hybrid layer that contains both different compounds and that extends parallel to a front surface. Hence, within said X-Y plane, a pattern of one of the compounds is provided. The pattern is chosen to optimize certain end properties of the circuit package.

Figure 11:
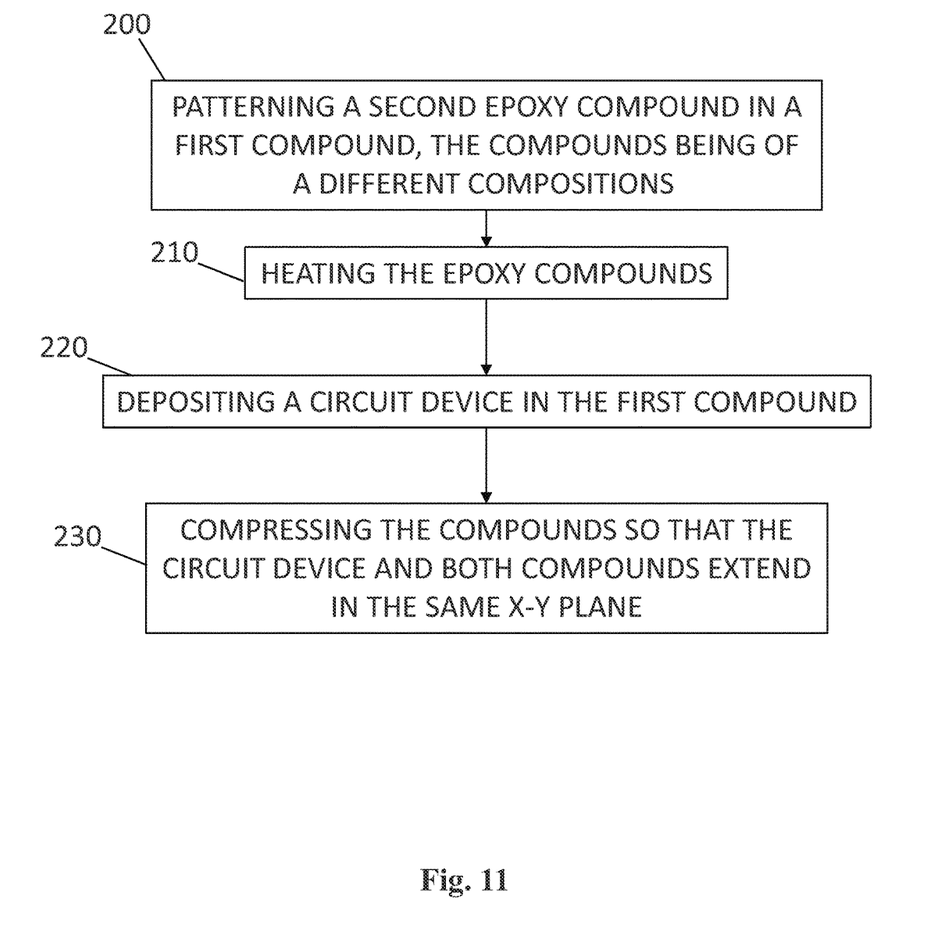
FIG. 11 illustrates a flow chart of another example of a method of compression molding.
Figure 12A:
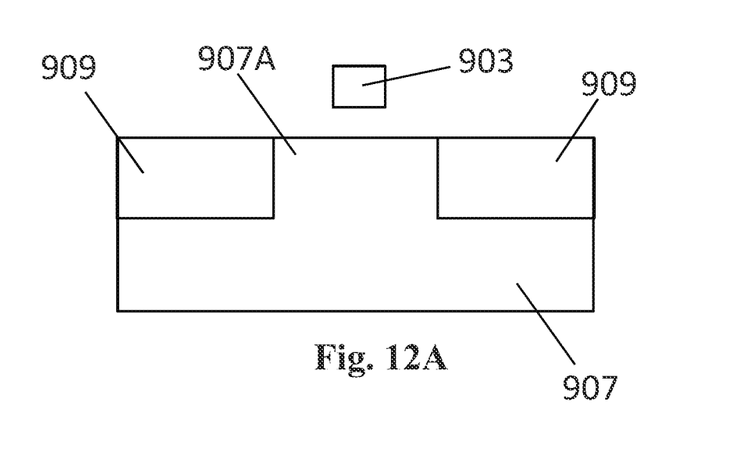
FIG. 12A illustrates an example of a circuit device and a plurality of epoxy mold compounds before compression molding.
Figure 12B:
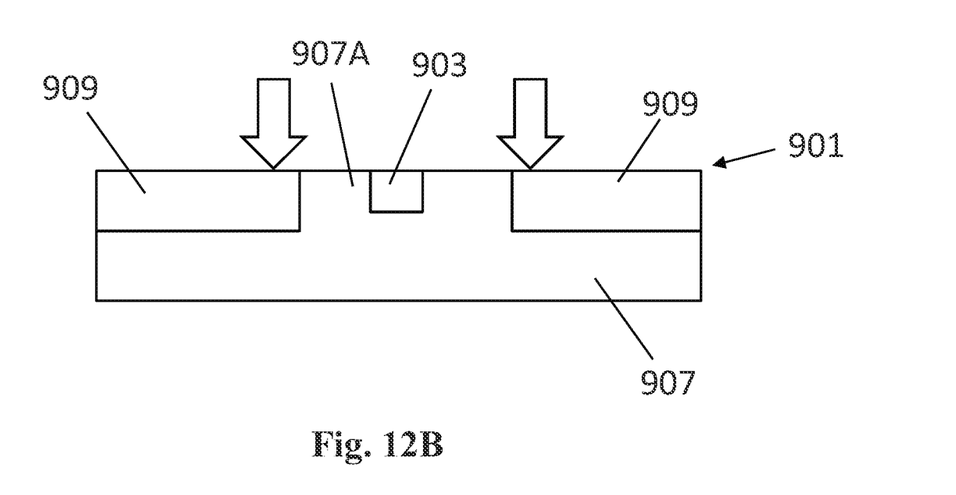
FIG. 12B illustrates an example of a circuit package after compression molding the circuit device and compounds of FIG. 12A.

FIGS. 11 and 12A and 12B illustrates a flow chart and diagrams, respectively, of a further example of compression molding a circuit package. The method includes patterning a second epoxy mold compound 909 with respect to a first epoxy mold compound 907, the compounds 907, 909 being of different compositions (block 200). The compounds 907, 909 can be deposited on a carrier or directly in a mold. For example the pattern can include islands 907A like dots or more complex patterns, see FIG. 12A. The method includes heating the epoxy mold compounds 907, 909 (block 210), depositing a circuit device 903 in one of the first epoxy mold compound or second epoxy mold compounds (block 220), depending on the type of property desired, and compressing the compounds so that the circuit device and compounds extend in the same X-Y plane (block 230). In FIG. 12B the circuit device 903 has been deposited in the first epoxy mold compound 907, compressed and cooled to form package 901.

Some of the described example packagings of this disclosure include multiple epoxy mold compounds having different CTEs. In an example, the CTEs of the epoxy mold compounds of this description can be determined by a weight percentage of fillers in the epoxy mold compound. For example, the CTE is inversely proportional to a filler concentration in the compound. In one example the first epoxy mold compound has a weight percentage of fillers of approximately 90%, corresponding to a CTE of approximately 6 ppm/C. An example of an industry standard epoxy mold compound having such characteristics is CEL400ZHF40 W from Hitachi Chemical, Ltd®. For example the second epoxy mold compound has a weight percentage of fillers of approximately 87% and a CTE of approximately 9 ppm/C. An example of an industry standard epoxy mold compound having such characteristics is CEL400ZHF40 W-87. In other examples the weight percentage of filler in the first epoxy mold compound can be between 87 and 91%. For example the CTE of the first epoxy mold compound can be between approximately 6 and 9 ppm/C. In another example the weight percentage of filler in the second epoxy mold compound can be between 82 and 87%. For example, the CTE of the second epoxy mold compound is between 9 and 14 ppm/C. A different example of different CTEs of the first and second epoxy mold compound is 6 ppm/C and 13 ppm/C, respectively. An example of a CTE of a silicon of which a circuit device may be composed is approximately 3 ppm/C.

Some of the examples of this disclosure describe placement of an extra epoxy mold compound of a different composition than a bulk epoxy mold compound, next to the circuit devices and the bulk epoxy compound, hence providing for a "patterning" effect in a hybrid layer of both compounds. Effects of such example circuit packages may include at least one of reducing bow, increasing design space, improving fluidic properties, improving electrical properties, and/or eliminating the need to add components or manufacturing process steps.

The circuit package of the various examples described in this disclosure may be a subcomponent of a larger package or device, or an intermediate product of an end product. For example multiple other layers or components can be attached to the back or front surface. Hence, when the circuit package is a subcomponent, the back or front surface may not be visible or not apparent.

The various examples of circuit packages and manufacturing methods may relate to integrated circuit packaging for example for computer components. In further examples, the packages and methods may involve fluidic applications such as 2D or 3D printing, digital titration, other microfluidic devices, etc. In different examples, the fluid may include liquids, inks, printing agents, pharmaceutical fluids, biofluids, etc.

The example circuit packages can have any orientation: the descriptive terms "back" and "front" should be understood as relative to each other only. Also, the example sheets or panels of this disclosure have a thickness in a Z-direction and a width and length along an X-Y plane. The thickness of the package may be relatively thin with respect to the width and length. In certain examples, the filler density varies over the thickness.

What is claimed is:

1. A circuit package panel comprising
a front and back face,
a packaging of epoxy mold compounds, and
a circuit device in the packaging, wherein
the packaging comprises, parallel to the front face, at least one hybrid layer of a first epoxy mold compound and next to it a second epoxy mold compound of a different composition;
wherein
the circuit device is a fluidic device comprising a fluid channel array, and
the second compound comprises fluid holes to deliver fluid to the circuit device.
2. The circuit package of claim 1 comprising an array of circuit devices.
3. The circuit package of claim 1 wherein
the circuit device extends in the first compound, and,
the second compound surrounds the first compound.
4. The circuit package of claim 3 wherein the first compound extends under the circuit device and under the second compound.
5. The circuit package of claim 4 wherein the second compound has a higher CTE than the first compound.
6. The circuit package of claim 1 wherein the first and second compounds have a different CTE (Coefficient of Thermal Expansion) and the circuit device has a lower CTE than the compounds.
7. The circuit package of claim 1 wherein the second compound has a lower weight percentage of fillers than the first compound.
8. The circuit package of claim 1 wherein the second compound has finer fillers, on average, than the first compound.
9. The circuit package of claim 1 wherein the circuit devices each comprise relatively thin slivers having nozzle arrays of at least 300 nozzles per inch and having a width: length ratio of at least 1:25.
10. The circuit package of claim 1, wherein the second epoxy mold compound has a different Coefficient of Thermal Expansion (CTE) than the first epoxy mold compound, the second epoxy mold compound having a different weight percentage of fillers than the first epoxy mold compound to achieve the different CTE of the second epoxy mold compound.
11. The circuit package of claim 10, further comprising at least two additional caps of different epoxy mold compounds between the first and second epoxy mold compounds having varying filler densities.
12. The circuit package of claim 10, wherein a filler density increases in a direction away from the circuit device as among the first and second epoxy mold compounds and the additional caps between the first and second epoxy mold compounds, such that a gradient of filler densities is provided in the packaging around the circuit device.
13. The circuit package of claim 10, wherein a filler density decreases in a direction away from the circuit device as among the first and second epoxy mold compounds and the additional caps between the first and second epoxy mold compounds, such that a gradient of filler densities is provided in the packaging around the circuit device.
14. The circuit package of claim 10, wherein
the circuit device is disposed in the first compound, and,
the second compound surrounds the first compound,
wherein the first compound extends under the circuit device and under the second compound.
15. The circuit package of claim 10, wherein the second epoxy mold compound has a lower CTE than the first epoxy mold compound, the second epoxy mold compound having a higher density of fillers than the first epoxy mold compound to achieve the lower CTE of the second epoxy mold compound.
16. The circuit package of claim 10, wherein the second epoxy mold compound has a higher Coefficient of Thermal Expansion (CTE) than the first epoxy mold compound, the second epoxy mold compound having a lower weight percentage of fillers than the first epoxy mold compound to achieve the higher CTE of the second epoxy mold compound.
17. A circuit package, comprising
a packaging formed of a plurality of different epoxy mold compounds, the packaging having a front face; and
a circuit device disposed in the packaging near the front face;

said plurality of epoxy mold compounds comprising, parallel to the front face, at least one hybrid layer of
- a bulk epoxy mold compound, and
- a second epoxy mold compound of a different composition than the bulk epoxy mold compound, next to the bulk epoxy mold compound; and at least two additional caps of different epoxy mold compounds between the first and second epoxy mold compounds, the mold compounds having varying Coefficients of Thermal Expansion (CTE) based on varying filler density, where filler density decreases, increases and then decreases again in a direction away from the circuit device moving through the epoxy mold compounds.

* * * * *